United States Patent
Onoda

(10) Patent No.: US 7,688,239 B2
(45) Date of Patent: Mar. 30, 2010

(54) FAULT DETECTION APPARATUS FOR DETECTING FAILURE OF A/D CONVERTER DUE TO LOSS OF EXTERNALLY SUPPLIED CLOCK SIGNAL

(75) Inventor: Hiromitsu Onoda, Toyohashi (JP)

(73) Assignee: Denso Corporation, Kariya (JP)

( * ) Notice: Subject to any disclaimer, the term of this patent is extended or adjusted under 35 U.S.C. 154(b) by 107 days.

(21) Appl. No.: 12/077,184

(22) Filed: Mar. 17, 2008

(65) Prior Publication Data

US 2008/0231490 A1 Sep. 25, 2008

(30) Foreign Application Priority Data

Mar. 20, 2007 (JP) ............... 2007-073321

(51) Int. Cl.
  *H03M 1/10* (2006.01)
(52) U.S. Cl. ................. 341/120; 341/141; 341/155
(58) Field of Classification Search ............... 341/120, 341/141, 155
  See application file for complete search history.

(56) References Cited

U.S. PATENT DOCUMENTS

| | | | | |
|---|---|---|---|---|
| 5,432,514 | A * | 7/1995 | Mukuda et al. | 341/120 |
| 6,646,589 | B2 * | 11/2003 | Natsume | 342/70 |
| 6,873,272 | B2 * | 3/2005 | Pezzini | 341/120 |
| 6,930,629 | B1 * | 8/2005 | Saito | 341/155 |
| 7,009,537 | B2 * | 3/2006 | Kabune | 341/120 |
| 7,286,068 | B2 * | 10/2007 | Stanley et al. | 341/120 |
| 2003/0052813 | A1 | 3/2003 | Natsume | |
| 2006/0181448 | A1 | 8/2006 | Natsume et al. | |

FOREIGN PATENT DOCUMENTS

| | | |
|---|---|---|
| JP | 62-136129 | 6/1987 |
| JP | 04-031835 | 3/1992 |
| JP | 2002-044854 | 2/2002 |
| JP | 2003-161776 | 6/2003 |
| JP | 2006-220624 | 8/2006 |
| JP | 2006-275776 | 10/2006 |
| JP | 2006-304365 | 11/2006 |

OTHER PUBLICATIONS

Office action dated Dec. 24, 2008 in Japanese Application No. 2007-073321.
Office action dated Aug. 4, 2009 in corresponding Japanese Application No. 2007-073321.

* cited by examiner

*Primary Examiner*—Khai M Nguyen
(74) *Attorney, Agent, or Firm*—Harness, Dickey & Pierce, PLC

(57) ABSTRACT

An A/D converter performs successive A/D conversion operations that are synchronized with respective periods of an externally supplied clock signal. A set of output digital data produced from the A/D converter, following each A/D conversion, is acquired a plurality of times in succession within an interval that extends to the start of the next A/D conversion operation. If identical sets of data are not obtained in the successive acquisitions, then it is determined that there is failure of the A/D converter due to loss of the external clock signal.

4 Claims, 4 Drawing Sheets

NORMAL OPERATION

FAILURE CONDITION

NORMAL OPERATION

FAILURE CONDITION

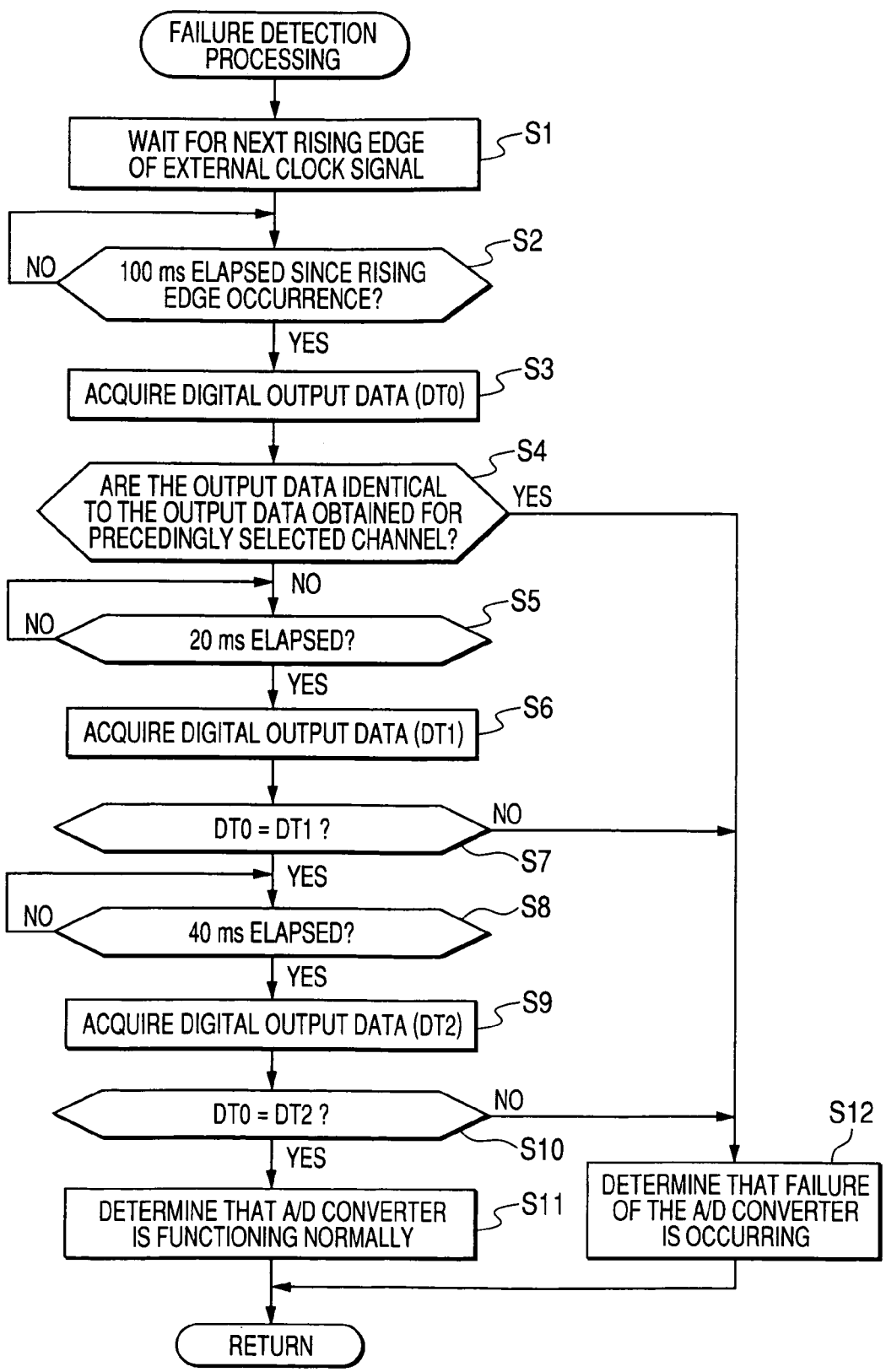

FAULT DETECTION APPARATUS FOR DETECTING FAILURE OF A/D CONVERTER DUE TO LOSS OF EXTERNALLY SUPPLIED CLOCK SIGNAL

CROSS-REFERENCE TO RELATED APPLICATIONS

This application is based on and incorporates herein by reference Japanese Patent Application No. 2007-073321 filed on Mar. 20, 2007.

BACKGROUND OF THE INVENTION

1. Field of Application

The present invention relates to a fault detection apparatus for detecting failure of an A/D (analog-to-digital) converter, and in particular to a fault detection apparatus for an A/D converter which operates from an externally supplied clock signal, whereby the fault detection apparatus can detect failure caused by loss of that clock signal.

2. Description of Related Art

A type of A/D converter is known, for example as described in Japanese Patent Publication No. 2006-304365 (referred to in the following as reference document 1), having three or more channels with respective input terminals, for inputting respective analog voltage signals, with the analog voltage signals being converted to digital values. With the apparatus of reference document 1, failure of the A/D converter is detected as follows. At least two analog voltages are predetermined, and the respectively corresponding digital values that result from A/D conversion of these analog voltages (i.e., when the A/D converter is operating normally) are also predetermined. A/D conversion is applied to the two analog voltages and the relationship between the digital values resulting from that conversion is compared with a predetermined relationship. If the detected relationship does not correspond to the predetermined relationship, then it can be determined that there is failure of the A/D converter.

In the case of an A/D converter which performs conversion in synchronism with an externally supplied clock signal (referred to in the following simply as an external clock signal), if the signal lead through which the external clock signal is supplied should become open-circuited, the A/D conversion will cease to be synchronized with the external clock signal. Hence, digital data will be outputted which have been derived through A/D conversions performed at random timings. Thus is necessary to be able to detect such an occurrence, as a failure of the A/D converter. However the apparatus of reference document 1 does not detect an A/D converter failure that results from an open-circuit of the connecting lead that supplies the external clock signal. Furthermore, the failure detection method that is used with reference document 1 is applicable only to an A/D converter having three or more signal input channels, and in particular, cannot be used in the case of an A/D converter having a single input channel.

SUMMARY OF THE INVENTION

It is an objective of the present invention to overcome the above problems, by providing a fault detection apparatus for an A/D converter which performs A/D conversions in synchronism with an external clock signal, whereby it becomes possible to detect a failure of the A/D converter that results from a loss of the external clock signal.

To achieve the above objective, the invention provides a fault detection apparatus for an A/D converter that receives an externally supplied clock signal and performs periodic A/D conversion operations on an analog signal, synchronized with respective periods of the external clock signal. During each period of the external clock signal, the fault detection apparatus performs a plurality of successive data acquisition operations during a specific interval extending from completion of an A/D conversion operation until the start of the succeeding period of the external clock signal, with a set of output digital data produced from the A/D converter being acquired by the fault detection apparatus in each of the data acquisition operations. The resultant acquired sets of output digital data are compared with one another, and if at least one of them differs from any of the others, then it is determined that there is a failure of the A/D converter.

With such an A/D converter, with an A/D conversion being initiated once in each period of the external clock signal, i.e., the output digital data from the A/D converter are updated only once in each period of the external clock signal. Thus when the A/D converter is operating normally, with an A/D conversion being initiated at the start of a period of the external clock signal, the output digital data from the A/D conversion will remain unchanged (after the conversion is completed) until the start of the next period of the external clock signal.

However if loss of the external clock signal occurs, e.g., due to an open-circuit condition of a connecting lead that supplies the external clock signal to the A/D converter, then A/D conversions may be initiated at random timings that are not synchronized with the external clock signal. In such a condition, the output digital data from the A/D converter will vary during the aforementioned specific interval, within some periods of the external clock signal. Thus with the present invention, failure of the A/D converter is detected by detecting when variation of the output digital data occurs during the aforementioned specific interval within a period of the external clock signal. This detection is based on determining (in each period of the external clock signal) whether each of the aforementioned sets of acquired digital data are identical to one another.

In particular, the A/D converter may include an input circuit which receives the external clock signal and generates an internal clock signal that is synchronized with the external clock signal. In such a case, when an open-circuit condition occurs in a connecting lead that supplies the external clock signal to the input circuit, a high level of impedance will arise at the input of the input circuit. Thus, noise pulses and spikes may be generated in place of the internal clock signal, causing A/D conversion operations to be executed that are not synchronized with the external clock signal.

The invention can be advantageously applied to an A/D converter which receives an input analog signal that is one of set of analog signals from respective channels, which are cyclically selected to be inputted to the A/D converter. In this case, the output digital data produced from the A/D converter as a result of an A/D conversion performed on the currently selected channel signal are compared with the output digital data produced for the precedingly selected channel signal. If the A/D converter is functioning normally, the output digital data obtained for the precedingly selected channel signal will be different from that obtained for the currently selected channel signal. However if A/D conversion operations are not being performed in synchronism with the external clock signal, the output digital data may remain unchanged after switching of the channel signal occurs. Hence, if the output digital data obtained for the precedingly selected channel signal are found to be identical to the output digital data obtained for the currently selected channel signal, then it is determined that failure of the A/D converter is occurring.

The invention is particularly applicable to an A/D converter which performs A/D conversion of a received signal derived from received reflected radar waves by a millimeter-band radar apparatus, i.e., with the reflected radar waves resulting from reflection of transmitted radar waves from an object, and with the digital data obtained by the A/D converter being utilized by the radar apparatus for detecting the distance and relative velocity of the object. By ensuring that failure of the A/D converter can be rapidly detected and a specific cause (loss of the external clock signal) can be rapidly diagnosed, the reliability of such a radar apparatus can be enhanced

BRIEF DESCRIPTION OF THE DRAWINGS

FIG. 5 is a flow diagram of a processing routine executed by the embodiment, for detecting failure of the A/D converter.

DESCRIPTION OF PREFERRED EMBODIMENTS

Figure 1:
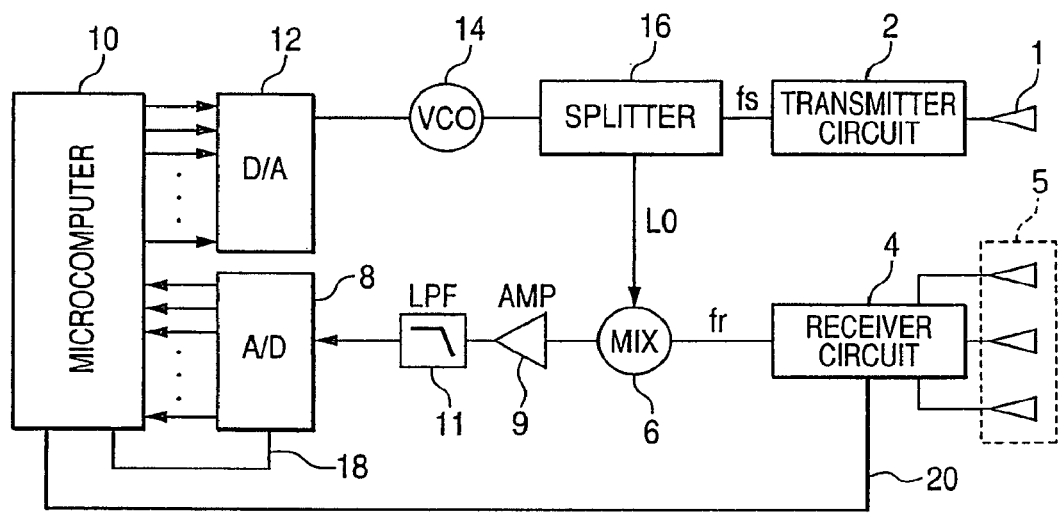
FIG. 1 is a block diagram showing the overall configuration of an embodiment of a FMCW radar apparatus.
Figure 2:
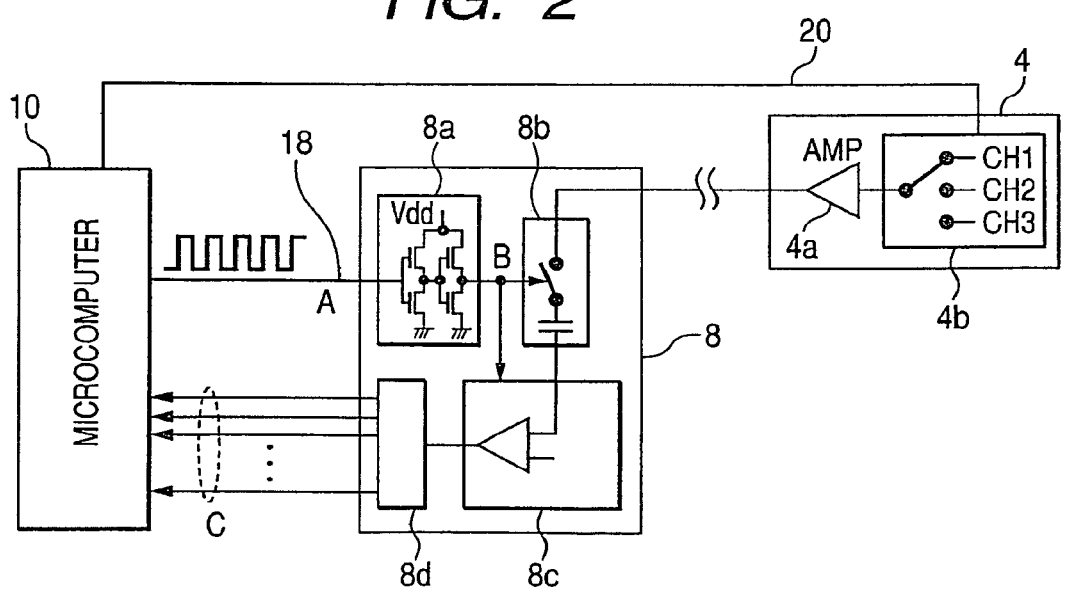
FIG. 2 illustrates the internal configurations of an A/D converter and a receiver circuit of the FMCW radar apparatus.

An embodiment of a fault detection apparatus will be described in the following, referring to the drawings. The embodiment is incorporated in an A/D converter which forms part of a FMCW (frequency modulation continuous-wave) radar apparatus. FIG. 1 is a block diagram showing the overall configuration of the FMCW radar apparatus, while FIG. 2 is a block diagram illustrating the internal configuration of a receiver circuit 4 and showing a clock signal supply lead 18, in the FMCW radar apparatus. The FMCW radar apparatus is installed in a vehicle, and is utilized for detecting the distance and relative velocity (with respect to the vehicle) of objects that are located ahead of the vehicle along its travel path, e.g., preceding vehicles.

As shown, the FMCW radar apparatus of FIG. 1 is essentially formed of a transmitting antenna 1, a transmitter circuit 2, a receiver circuit 4, a receiving antenna array 5, a mixer 6, an A/D converter 8, a microcomputer 10, a D/A converter 12 and a VCO (voltage control oscillator) 14. The receiving antenna array 5 is made up of a set of three receiving antennas as shown. Millimeter-band radar waves are transmitted from the transmission antenna 1. The microcomputer 10 supplies successive digital values to the D/A converter 12, with these values successively increasing, and successively decreasing, in a cyclically repeated pattern. The D/A converter 12 there produces an analog voltage signal that cyclically increases and decreases, which is applied to correspondingly modulate the frequency of a high-frequency signal (i.e., at a frequency in the millimeter-band range) which is produced by the VCO 14. The output signal from the VCO 14 is separated into a transmission signal fs and a local oscillator signal LO by a splitter 16. The transmission signal fs is supplied to the transmitter circuit 2, to be transferred to the transmitting antenna 1, and the local oscillator LO is supplied to the mixer 6.

Millimeter-band radar waves are thereby transmitted from the transmitting antenna 1, and reflected from any preceding object such as a preceding vehicle. The reflected radar waves are received by the receiving antenna array 5, and each of the three antennas of the receiving antenna array 5 thereby produces a resultant signal in accordance with the received radar waves. These received signals from the three antennas are transferred via respective channels (designated as CH1, CH2, CH3) to the receiver circuit 4. The receiver circuit 4 cyclically selects the received antenna signals of the respective channels, with the selected channel signal being amplified by a predetermined factor by an amplifier 4a shown in FIG. 2, to be then outputted as a received signal fr.

Also as shown in FIG. 2, the receiver circuit 4 includes a channel switch 4b that is controlled for selecting the antenna signal of the appropriate one of the three channels CH1, CH2, CH3. Changeover operation of the channel switch 4b is controlled by a channel selection signal, produced from the microcomputer 10 and supplied via a channel selection signal supply lead 20.

The received signal fr is mixed with the local oscillator signal LO in the mixer 6, to obtain a beat signal, i.e., an analog signal having a frequency (beat frequency) equal to the frequency difference between the received signal fr and the local oscillator signal LO. The beat signal is transferred via an amplifier 9 and a LPF (low-pass filter) 11 to the A/D converter 8.

With this embodiment, the A/D converter 8 has 16-bit resolution, with one input channel and one output channel. The A/D converter 8 converts successive sample of the beat signal into respective digital values, in synchronism with an external clock signal that is supplied from the microcomputer 10 via a signal lead that is designated as the external clock signal lead 18. The beat signal is thereby converted to digital data that are supplied to the microcomputer 10. The microcomputer 10 processes these data, for calculating the distance and relative velocity of a preceding object located ahead of the vehicle.

The period of the external clock signal (i.e., the A/D conversion sampling period) is 200 msec and the external clock signal is a pulse signal with a duty ratio of 50%. With this embodiment, the external clock signal is generated by the microcomputer 10. However it would be equally possible to use a separate source of the external clock signal, such as a timer. If a separate timer is utilized, then the microcomputer 10 can be configured to produce a designation signal for specifying the start of time measurement by the timer. The timer would then repetitively measure successive time intervals each corresponding to a sampling interval, and when the number of repetitions (number of sampling intervals) reaches a predetermined number, the time measurement by the timer would be halted.

The microcomputer 10 is based on a CPU (central processing unit) together with a ROM (read-only memory) and RAM (random access memory), and calculates the distance and relative velocity of a preceding object such as a preceding vehicle based on the digital data supplied from the A/D converter 8. The microcomputer 10 executes these calculations utilizing the FFT (fast Fourier transform) to perform frequency analysis of the digital data. The calculated distance and relative velocity information may for example be supplied to a constant-speed control apparatus of the vehicle, which performs an inter-vehicle distance control function, i.e., with the information being used in maintaining a fixed distance between the vehicle in which the embodiment is installed and a preceding vehicle.

The principles involved in detecting the distance and relative velocity of a preceding object using such a type of FMCW radar apparatus are described for example in Japanese patent publication No. 2006-220624, so that detailed description is omitted herein.

The A/D converter 8 of this embodiment is configured as an IC (integrated circuit). Since the operating principles of such A/D converters are well known, detailed description is omitted herein. As shown in FIG. 2, the A/D converter 8 includes an input circuit 8a, a sample-and-hold circuit 8b, a comparator section 8c and an output circuit 8d. The input circuit 8a is made up of CMOS (complementary metal-oxide semiconductor) elements, and receives the external clock signal supplied from the microcomputer 10, to generate an internal clock signal that is synchronized with the external clock signal. The internal clock signal is supplied to both the sample-and-hold circuit 8b and the comparator section 8c.

Figure 3A:
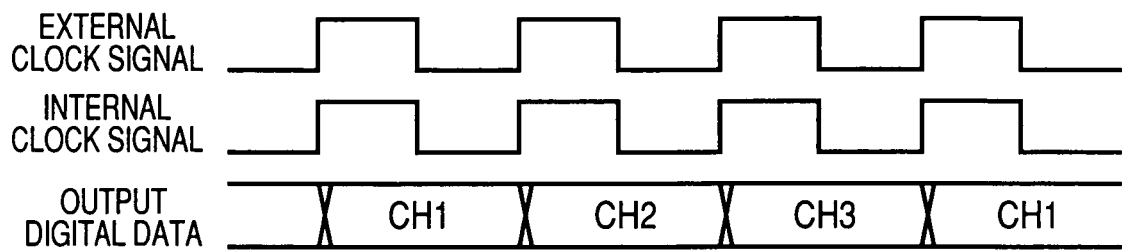
FIG. 3A shows timing diagrams for use in describing the operation of the A/D converter of FIG. 2 when functioning normally.

The sample-and-hold circuit 8b executes switching in synchronism with the internal clock signal. FIG. 3A is a timing diagram illustrating the time axis relationships between the external clock signal, the internal clock signal, and successive digital output values that are obtained for the beat signals of the respective channels CH1, CH2, CH3, during normal operation of the A/D converter.

When a rising edge of the internal (and external) clock signal occurs (after the receiver circuit 4 has been controlled to select the next one of the channels CH1, CH2, CH3), an A/D conversion is initiated. Specifically, a switch in the sample-and-hold circuit 8b becomes momentarily closed, causing the voltage of the beat signal (of the selected one of the channels CH1, CH2, CH3) to be applied to charge a capacitor in the sample-and-hold circuit 8b. The switch is then opened, and the capacitor is discharged to the comparator section 8c, i.e., a sample of the voltage level of the beat signal is inputted to the comparator section 8c. As is well known with such a type of A/D converter, the level of the sample voltage is compared with values of a reference voltage Vref by the comparator section 8c, with a digital value being obtained for the sample based on the comparison results. That digital value is transferred to the output circuit 8d. Thereafter, the next one of the received signal channels CH1, CH2, CH3 is selected by the receiver circuit 4, then, beginning at the next rising edge of the internal (and external) clock signal, another A/D conversion as described above is performed, to obtain a digital value for a sample of the beat signal corresponding to the next-selected one of the channels CH1, CH2, CH3.

In that way, the digital values obtained for successive samples of the beat signal for each of the channels are supplied to the output circuit 8d (e.g., containing data registers and output encoders) for producing digital output data as a bit pattern in accordance with data values that have been produced from the output circuit 8c up to the current point in time. These digital output data are periodically acquired by the microcomputer 10.

Specifically, when the A/D converter 8 is operating normally, the output digital data are updated (i.e., when a new digital value is outputted from the comparator section 8c) only at each rising edge of the external (and internal) clock signal, to be then acquired by the microcomputer 10 at the next falling edge of the external (and internal) clock signal.

Figure 3B:
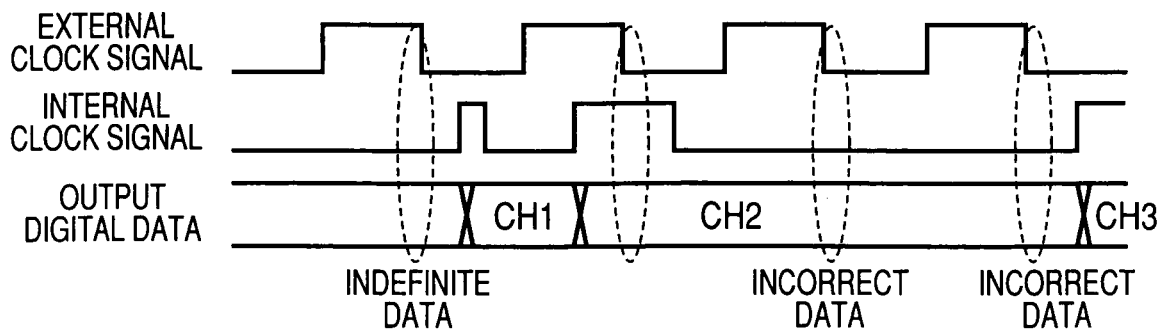
FIG. 3B shows corresponding timing diagrams for the case in which there is failure of the A/D converter due to open-circuit of an external clock signal supply lead.

The method of detecting failure of the A/D converter 8 with this embodiment will be described in the following. FIG. 3A described above illustrates the operation of the A/D converter 8 when it is functioning normally. FIG. 3B is a corresponding timing diagram for the case in which failure of the A/D converter 8 has occurred due to an open-circuit in the clock signal supply lead 18, so that randomly occurring pulses (due to electrical noise, etc.) appear in place of the internal clock signal.

Such an open-circuit condition of the clock signal supply lead 18 can occur when there is a break in a connecting lead formed in a pattern on a printed-circuit board, or there is a defect in a solder connection between an IC and substrate, or a defect within the input circuit 8a itself. In such a condition, the impedance at the input of the input circuit 8a will become extremely high, so that randomly occurring pulses may be supplied to the input circuit 8a (in place of the internal clock signal) that result from the effects of electrical noise or of fluctuations in the power supply voltage of the A/D converter 8, and so are not synchronized with the external clock signal.

In this condition, with the input circuit 8a initiating A/D conversion operations at rising edges of randomly occurring pulses instead of the internal clock signal, the microcomputer 10 will acquire data that are irregularly varying and erroneous, at respective falling edges of the external clock signal.

Figure 4A:
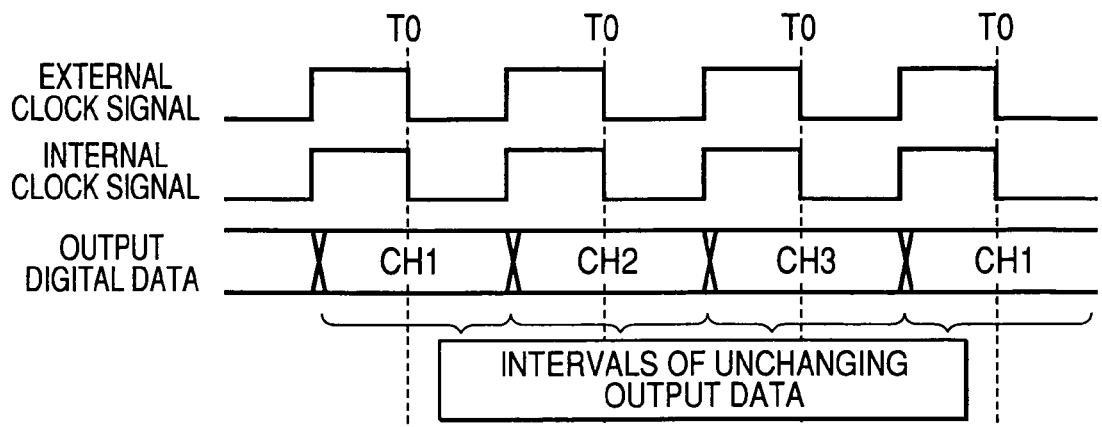
FIGS. 4A and 4B are timing diagrams for use in describing failure detection processing that is performed with the embodiment.

Considering the case of normal operation of the A/D converter 8, illustrated in FIG. 4A, after the next channel has been selected by the receiver circuit 4, and a rising edge of the external (and internal) clock signal then occurs, the digital value that is then obtained by the comparator section 8c and supplied to the output circuit 8d will be held unchanged (so that the digital output data from the output circuit 8d will remain unchanged) until the next rising edge of the external (and internal) clock signal occurs. That is to say, during normal operation of the A/D converter 8, after a rising edge has occurred at the start of a period of the external control signal and an A/D conversion then performed, the data that are outputted from the A/D converter 8 will be held unchanged until the start of the next period of the external clock signal.

Figure 4B:
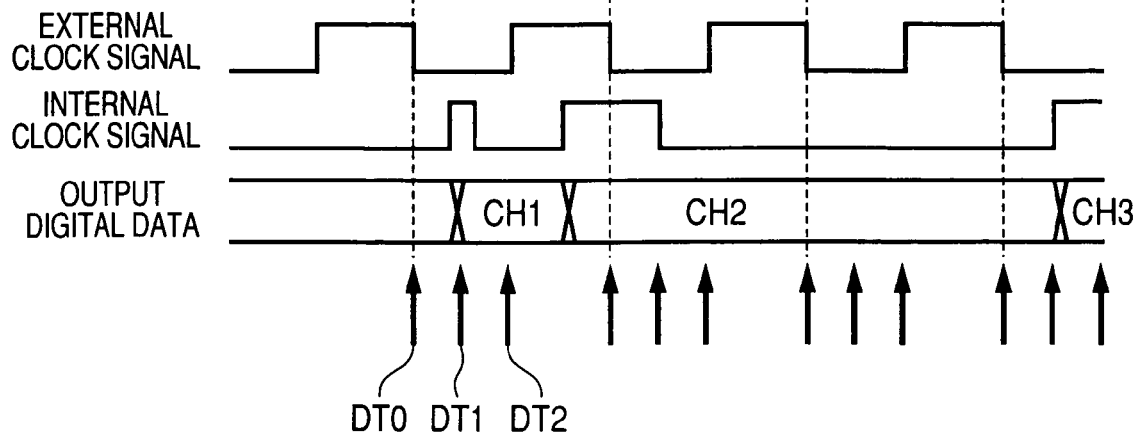

Hence as illustrated in FIG. 4B, when loss of the external clock signal occurs, so that the A/D converter 8 ceases to operate in a condition in which the output data remain unchanged during each period of the external clock signal, this failure condition can be detected by the microcomputer 10, by acquiring the output data from the A/D converter 8 after successive amounts of elapsed time (for example, 20 msec) have occurred following acquisition of data from the A/D converter 8 (with the acquisitions occurring at each time point T0 shown in FIG. 4A).

In the example of FIG. 4B, in each period of the external clock signal, after output data DT0 have been acquired by the microcomputer 10 from the A/D converter 8 at time point T0, output data DT1 are then acquired at time point DT1 (after 20 msec has elapsed), then output data DT2 are acquired (after a further 20 msec). If there is a difference between the data acquired as DT0 and DT1 respectively, or between the data acquired as DT0 and DT2 respectively, then it can be judged that failure of the A/D converter 8 is occurring due to an open-circuit condition of the clock signal supply lead 18 (i.e., loss of the external clock signal).

With a FMCW radar apparatus having only a single receiver channel that is subjected to A/D conversion, when failure of the A/D converter occurs, this can have an adverse effect upon detection of the distance and relative velocity of a preceding object. However with this embodiment, failure of the A/D converter of such a type of radar apparatus can be rapidly detected, thereby increasing the reliability of the radio apparatus.

The processing executed by the microcomputer 10 for performing such failure detection by this embodiment will be described referring to the flow diagram of FIG. 5. Firstly, when power to the receiver apparatus is switched on, various initialization operations are first performed by the microcomputer 10 (initialization of I/O ports, checking of RAM and ROM, etc.,), and when this is completed, S1 of FIG. 5 is executed. In step S1 the condition of the external clock signal (having a period of 200 msec and duty ratio of 50%) is monitored, and operation waits until it is judged that a rising edge of the external clock signal has been reached. Step S2 is then executed, in which a decision is made as to whether a time interval of 100 msec has elapsed since the last rising edge of the external clock signal.

If there is a YES decision in step S2 (i.e., the next falling edge of the external clock signal has been reached), operation advances to step S3, while otherwise a wait is performed until 100 msec has elapsed.

In the following description, it will be assumed for simplicity that step S3 has been previously performed to acquire data of a precedingly selected one of the channels CH1, CH2, CH3 (i.e., it is assumed that this is not an initial execution of steps S3, S4 etc., occurring immediately after power to the radar apparatus has been switched on).

In step S3, output data DT0 are acquired from the A/D converter 8 at time point T0 (i.e., at the next falling edge of the external clock signal, following the rising edge that was detected in step S1). Next, in step S4, a decision is made as to whether the output data acquired in step S3 are identical to the data that were similarly acquired in the preceding execution of step S3 for the precedingly selected one of the channels CH1, CH2, CH3.

If there is a YES decision in step S4, then operation proceeds to step S12, in which it is determined that there is a fault condition of the A/D converter 8. If there is a No decision in step S4, then operation proceeds to step S5.

If the A/D converter 8 is operating normally, then when the receiver circuit 4 switches from selecting one of the channels CH1, CH2, CH3 to selecting a succeeding one of the channels, the output data acquired by the microcomputer 10 from the A/D converter 8 for the precedingly selected channel will be different from the output data that is acquired for the currently selected channel. However if the A/D converter 8 loses the external clock signal due to an open-circuit condition of the clock signal supply lead 18, etc., so that the internal clock signal occurs asynchronously with respect to the external clock signal so that A/D conversions are not synchronized with the external clock signal, the same output data may continue to be outputted from the A/D converter 8 after switching to a different one of the channels CH1, CH2, CH3 has been executed. Hence, this condition is detected as a failure of the A/D converter 8, in step S4, i.e., a condition whereby the same output data are produced from the A/D converter 8 before and after channel switching is performed by the receiver circuit 4.

In step S5, a decision is made as to whether 20 msec has elapsed since the falling edge of the external clock signal (i.e., as to whether 120 msec has elapsed since the rising edge that was detected in step S1). If there is a YES decision in step S5, then operation proceeds to step S6, while if there is a NO decision, operation waits until it is detected that 20 msec has elapsed.

In step S6, the output data of the A/D converter 8 are acquired as DT1 (e.g., as illustrated in FIG. 4B), i.e., after 20 msec has elapsed since the output data were acquired as DT0.

Next in step S7, a decision is made as to whether the data DT0 and DT1 are identical to one another, i.e., to judge whether the output data from the A/D converter 8 have remained unchanged during the 20 msec that have elapsed since DT0 were acquired. If there is a YES decision then step S8 is executed, while if there is a NO decision then operation proceeds to step S12, in which it is determined that there is a fault condition of the A/D converter 8.

In step S8, a decision is made as to whether 40 msec has elapsed since the falling edge of the external clock signal (i.e., as to whether 140 msec has elapsed since the rising edge that was detected in step S1). If there is a YES decision in step S8, then step S9 is executed, while if there is a NO decision, operation waits until it is detected that 40 msec has elapsed since the last falling edge of the external clock signal.

In step S9, the output data of the A/D converter 8 are acquired as DT2, i.e., after 40 msec has elapsed since the output data were acquired as DT0.

Next in step S10, a decision is made as to whether the data DT0 and DT2 are identical to one another, i.e., to judge whether the output data from the A/D converter 8 have remained unchanged during the 40 msec that have elapsed since output data DT0 were acquired. If there is a YES decision then step S11 is executed, while if there is a NO decision then operation proceeds to step S12, in which it is determined that there is a fault condition of the A/D converter 8.

In step S11, it is determined that the A/D converter 8 is operating normally. Thereafter, when the receiver circuit 4 has switched to select the next one of the channels CH1, CH2, CH3, the above-described sequence of steps is repeated. The output data obtained after A/D conversion of a sample of the beat signal from the next-selected channel are thereby judged, to detect failure of the A/D converter 8, in the same way as described above.

If it is determined in step S12 that there is a failure of the A/D converter 8, then the microcomputer 10 generates information indicating that there is a failure of the A/D converter 8 of the FMCW radar apparatus, and supplies the information to equipment such as a body ECU of the vehicle (not shown in the drawings). The body ECU records the information as a corresponding diagnostics code. In that way, failure of the A/D converter 8 can be diagnosed, based on the diagnostics code.

When the above processing routine is first executed after switch-on of operating power, it will not be possible to perform the judgement of step S4, since there is not yet a "precedingly-selected channel" for which a digital value has been obtained by the A/D converter 8. Hence step S4 is omitted in the first execution of the processing of FIG. 5, performed immediately after power is switched on. This feature is omitted from FIG. 5 for simplicity of description.

As can be understood from the above, with this embodiment:

(1) after a new digital value (A/D converted value) has been derived by the A/D converter 8 at a sampling time point occurring at the start of a period of the external clock signal (rising edge of the internal clock signal, during normal operation), then at a subsequent data acquisition time point T0 (falling edge of the external clock signal) a set of output data DT0 from the A/D converter 8, incorporating the new digital value, is acquired by the microcomputer 10, (2) when respective predetermined first and second time intervals have successively elapsed following the data acquisition time point T0 (within an interval extending from the data acquisition time point T0 until the next sampling time point), corresponding first and second sets of output data DT1 and DT2 from the A/D converter 8 are successively acquired by the microcomputer 10 within an interval that extends between T0 and the start of the next period of the external clock signal, and (3) DT1 and DT2 are each compared with DT0, and if at least one of DT1 and DT2 is not identical to DT0 then it is judged that there is failure of the A/D converter 8 due to a loss of the external clock signal (e.g., due to an open-circuit condition of the clock signal supply lead 18).

Specifically with this embodiment, when the microcomputer 10 has acquired a new set of output data from the output circuit 8d of the A/D converter 8 at a falling edge of the external clock signal (T0), then after 20 msec have elapsed, that is compared with the output data now being outputted from the output circuit 8d. This operation is repeated after 40 msec have elapsed since the falling edge of the external clock signal. If a mismatch is detected as a result of either of these comparisons, then it is judged that the A/D converter 8 is malfunctioning due to a loss of the external clock signal.

In addition, with this embodiment, the output data DT0 are compared with output data from the A/D converter 8 that were acquired by the microcomputer 10 following an A/D conversion operation performed on the beat signal of the immediately precedingly-selected one of the channels CH1, CH2, CH3. If the acquired data DO are found to be identical to the output data that were acquired for the precedingly-selected channel, then it is judged that there is failure of the A/D converter 8 due to a loss of the external clock signal.

With the above embodiment, each initial data acquisition time point (T0 in FIG. 4A) occurs after one-half of the period duration of the external clock signal has elapsed, following initiation of an A/D conversion. However it would be possible to utilize other data acquisition timings. The essential point is that all of the acquired sets of output digital data (DT0, DT1, DT2 in FIG. 4B) must be acquired by the microcomputer 10 within an interval that extends between execution of an A/D conversion (with resultant updating of the digital output data produced from the A/D converter 8) up to the execution of the next A/D conversion.

It should be noted that the invention is not limited to the above embodiment, and that various modifications or alternative configurations could be envisaged, which fall within the scope claimed for the invention.

For example, in step S10 of FIG. 5, it would be possible to judge whether DT1 and DT2 are identical, instead of DT0 and DT2, and to determine that there a failure of the A/D converter 8 if DT1 and DT2 are not found to be identical.

Furthermore it would be possible to utilize a greater number of sets of digital output data than the three sets (DT1, DT1 and DT2) of the above embodiment, that are acquired within the aforementioned interval extending from a data acquisition time point (T0) until the start of the next A/D conversion operation, with the successive A/D conversion operations being synchronized with respective periods of the external clock signal (during normal operation) as described above.

What is claimed is:

1. A fault detection apparatus for an A/D (analog-to-digital) converter, said A/D converter being coupled to receive an externally supplied clock signal and configured to execute A/D conversion operations synchronized with respective periods of said external clock signal;

wherein said fault detection apparatus comprises circuitry configured to perform a plurality of successive data acquisition operations during each of said periods of said external clock signal, within an interval extending from completion of an A/D conversion operation until commencement of a succeeding period of said external clock signal, with a set of output digital data from said A/D converter being acquired in each of said data acquisition operations, compare respective acquired sets of output digital data that are thereby acquired during said specific interval, and determine that there is a failure of said A/D converter, when at least one of said acquired sets of output digital data is found to differ from another one thereof.

2. A fault detection apparatus for an A/D converter according to claim 1, wherein said A/D converter comprises an input circuit responsive to said external clock signal for generating an internal clock signal, and wherein said A/D converter is configured to perform said A/D conversions in synchronism with said internal clock signal, to derive said output digital data.

3. A fault detection apparatus for an A/D converter according to claim 1, comprising channel selection circuitry configured to select successive ones of a plurality of channel signals that are respective analog signals, and to supply a selected one of said channel signals to said A/D converter to be subjected to A/D conversion;

wherein said fault detection apparatus comprises circuitry configured to compare a set of output digital data that is obtained by A/D conversion of a currently selected one of said channel signals with a set of output digital data obtained by A/D conversion of an immediately precedingly-selected one of said channel signals, and when said set of output digital data obtained by A/D conversion of a currently selected channel signal is found to be identical to said set of output digital data obtained by A/D conversion of an immediately precedingly-selected channel signal, determine that there is a failure of said A/D converter.

4. A fault detection apparatus for an A/D converter according to claim 1, wherein said A/D converter performs A/D conversion of a received signal that is derived from received reflected radar waves by a millimeter-band radar apparatus, said reflected radar waves resulting from reflection of transmitted radar waves from an object, and said transmitted radar waves being transmitted by said radar apparatus, and wherein digital data obtained by said A/D conversion of said received signal are utilized by said radar apparatus for detecting a distance and relative velocity of said object.

* * * * *